United States Patent
Sass et al.

(10) Patent No.: US 7,885,077 B2
(45) Date of Patent: Feb. 8, 2011

(54) SOLDERLESS HEATSINK ANCHOR

(75) Inventors: Tony Carl Sass, Fuquay Varina, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 12/349,575

(22) Filed: Jan. 7, 2009

(65) Prior Publication Data

US 2010/0172102 A1 Jul. 8, 2010

(51) Int. Cl.
 *H05K 7/20* (2006.01)
(52) U.S. Cl. ............... 361/710; 361/704; 361/719; 174/260; 411/173; 411/508; 248/71
(58) Field of Classification Search ........... 361/704, 361/705, 710, 717, 719, 720, 10, 760
See application file for complete search history.

(56) References Cited

U.S. PATENT DOCUMENTS

| 5,734,556 | A | * | 3/1998 | Saneinejad et al. | ........... 361/719 |
| 5,759,004 | A | * | 6/1998 | Kuffel | ........... 411/508 |
| 5,881,800 | A | * | 3/1999 | Chung | ........... 165/80.3 |
| 5,917,701 | A | * | 6/1999 | Solberg | ........... 361/704 |
| 6,219,244 | B1 | | 4/2001 | Chen | |
| 6,301,113 | B1 | * | 10/2001 | Guerrero | ........... 361/704 |
| 6,496,371 | B2 | | 12/2002 | Winkel et al. | |
| 7,183,496 | B2 | * | 2/2007 | Arrigotti et al. | ........... 174/260 |
| 7,218,525 | B2 | | 5/2007 | Lo et al. | |
| 7,503,528 | B2 | * | 3/2009 | Adams et al. | ........... 248/71 |

OTHER PUBLICATIONS

Joy, E.F. et al. "Heat Sink Clamp", IBM Technical Disclosure Bulletin, vol. 26 No. 10A, Mar. 1984, pp. 5179-5180.

* cited by examiner

*Primary Examiner*—Jayprakash N Gandhi
*Assistant Examiner*—Courtney Smith
(74) *Attorney, Agent, or Firm*—Cynthia G. Seal; Jeffrey L. Streets

(57) ABSTRACT

A heatsink may be releasably secured to a substructure of an electronic system, such as a circuit board, in engagement with a heat-generating component, such as a processor. One embodiment provides an anchor that includes an anchor body, a hook coupled to the anchor body, a pair of flexible retention prongs extending from the anchor body in a common direction and spaced for insertion into openings on a circuit board, an optional pair of stabilization prongs extending from the anchor body adjacent to the flexible retention prongs, each having a width greater than the adjacent flexible retention prong, a barb disposed at the end of each prong and configured for retaining the anchor body on the circuit board upon insertion of the prongs into the openings on the circuit board, a spring integrated with the anchor body and having a free end spaced from the barbs a distance of less than the thickness of the circuit board, and a stop integrated with the anchor body for limiting the amount of insertion of the prongs beyond an initial contact of the free end of the spring with the circuit board. A heatsink clip releasably secures the heatsink to the hook of the anchor.

20 Claims, 3 Drawing Sheets

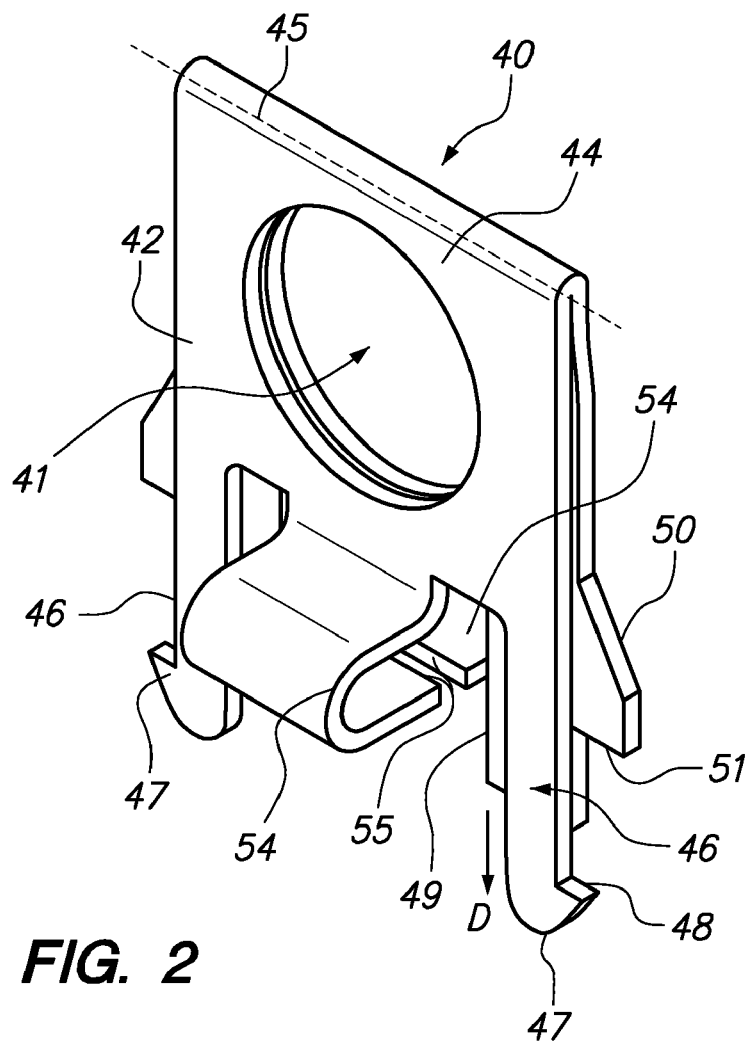
FIG. 2
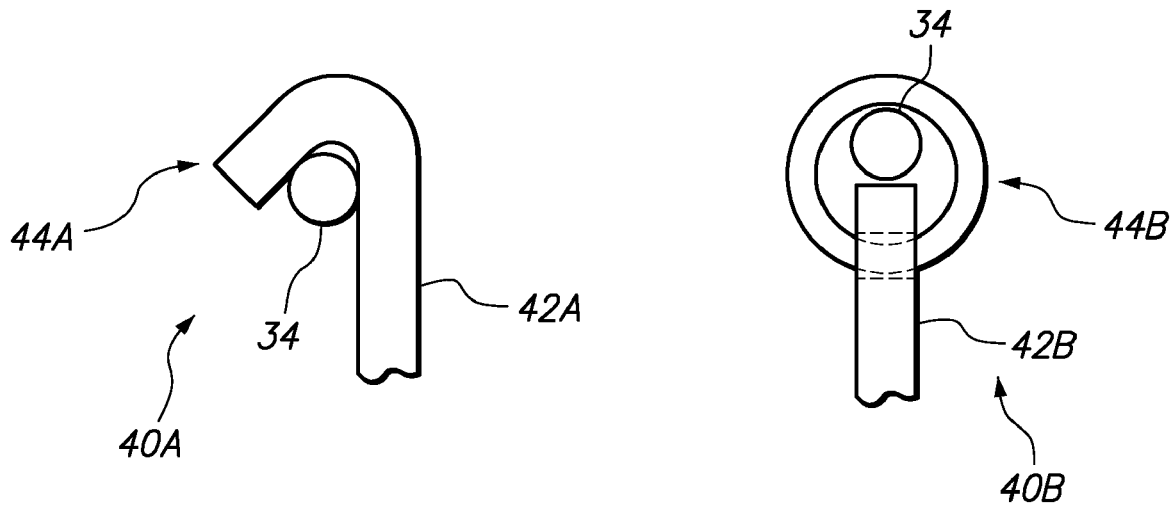
FIG. 2A  FIG. 2B

SOLDERLESS HEATSINK ANCHOR

BACKGROUND OF THE INVENTION

1. Field of the Invention

The present invention relates to methods and devices for securing a heat sink to an electronic substructure.

2. Background of the Related Art

A heatsink is commonly used to cool heat-generating components in electronic equipment, such as computer systems. For example, a processor, such as a central processing unit ("CPU"), generates a considerable amount of heat, and must be reliably cooled to remain operational and prevent damage to the CPU. A variety of methods and devices are known in the art for securing a heatsink to a circuit board. The importance of cooling heat-generating components such as CPUs leads to the desire for reliably securing a heatsink in a manner that ensures positive engagement between the heatsink and the heat-generating component to be cooled. The economics of computer system manufacturing leads to a desire for an economical manner of securing a heatsink.

BRIEF SUMMARY OF THE INVENTION

One embodiment of the present invention provides a heatsink anchor. The heatsink anchor includes an anchor body having a hook for receiving a heatsink clip. A pair of flexible retention prongs extend from the anchor body in a common direction, and have barbs on the ends. A stop is integrated with the anchor body and has an engagement portion between the hook and the barbs of the flexible retention prongs. A spring is integrated with the anchor body and has a free end spaced between the barbs and the stop.

Another embodiment of the invention provides an anchoring system for securing a heatsink to a circuit board. A pair of spaced-apart openings are provided on a circuit board adjacent to a heat-generating circuit-board element. An anchor includes an anchor body, a hook coupled to the anchor body, and a pair of flexible retention prongs extending from the anchor body in a common direction. The flexible retention prongs are spaced for insertion into the openings on the circuit board. A barb disposed at the end of each prong is configured for retaining the anchor body on the circuit board upon insertion of the prongs into the openings on the circuit board. A spring is integrated with the anchor body and has a free end spaced from the barbs a distance of less than the thickness of the circuit board. A stop is integrated with the anchor body for limiting the amount of insertion of the prongs beyond an initial contact of the free end of the spring with the circuit board. A heatsink clip is provided for releasably securing the heatsink to the hook of the anchor with the heatsink in direct thermal contact with the heat-generating circuit-board element.

BRIEF DESCRIPTION OF THE SEVERAL VIEWS OF THE DRAWINGS

FIG. 2 is a perspective view of one of the anchors of the heatsink anchoring system of FIG. 1.

FIG. 2A is a schematic side view of an anchor having an "open" hook for receiving the heatsink clip.

FIG. 2B is a schematic side view of an anchor having a hook comprising a closed ring or shackle for receiving the heatsink clip.

DETAILED DESCRIPTION OF THE INVENTION

One embodiment of the present invention provides an anchor having flexible retention prongs with barbs on the ends for releasably securing the anchor to a circuit board, along with stiffer stabilization prongs for anchor stability. The anchor may be secured to the circuit board by sliding the retention prongs and stabilization prongs into corresponding openings on the circuit board, in response to which the barbs on the flexible prongs lock the anchor on the circuit board. The anchor further includes one or more spring that engages the circuit board to limit anchor movement or "play." The spring also flexes to accommodate circuit boards of different thicknesses. A stop is provided to limit insertion of the retention prongs and stabilization prongs in the openings on the circuit board, and thereby to prevent over-compressing the spring. The anchor also includes a hook that extends away from the circuit board for coupling with a heatsink clip. The anchors may be easily connected to the circuit board without soldering the anchor to the circuit board. In some embodiments, the anchors are secured to the circuit board without requiring the use of separate fasteners or tools.

Another embodiment of the invention provides an anchoring system for releasably securing a heatsink to a circuit board in positive engagement with a processor. The anchoring system includes a heatsink clip and a pair of anchors. The anchors are securable to the circuit board, preferably on opposing sides of the processor or other heat generating device. The ends of a heatsink clip are releasably securable to the hooks on the anchors. By securing the ends of the heatsink clip to the adjacent anchors, the heatsink clip releasably secures the heatsink in direct thermal contact with the processor.

Figure 1:
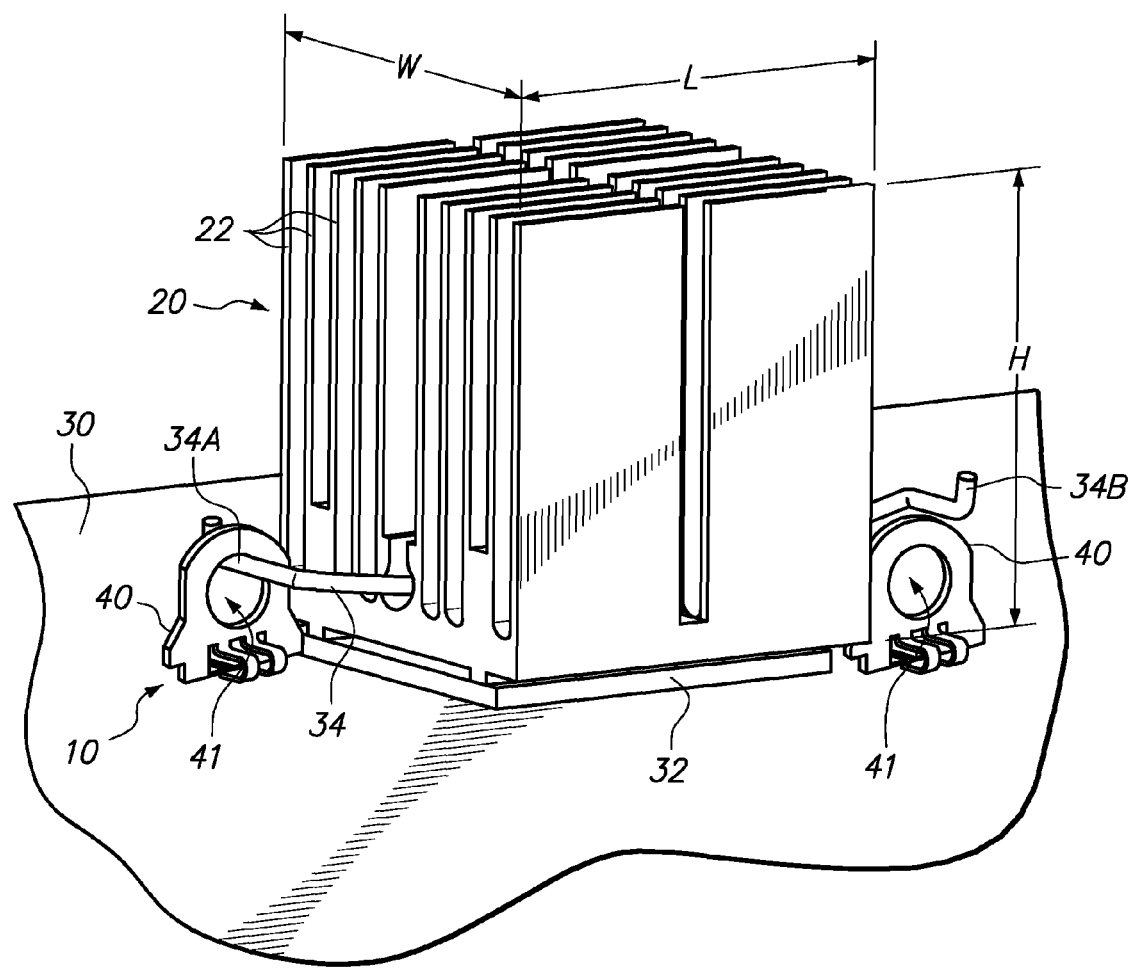
FIG. 1 is a perspective view of a heatsink anchoring system for releasably securing a heatsink to a circuit board in engagement with a processor on the circuit board.

FIG. 1 is a perspective view of a heatsink anchoring system generally indicated at 10 for releasably securing a heatsink 20 to a circuit board 30 in engagement with a heat-generating processor ("CPU") 32 on the circuit board 30. The heatsink anchoring system 10 includes anchors 40 releasably secured to a substrate of the circuit board 30 and a heatsink clip 34 that engages the heatsink and has two hooked ends 34A, 34B that are releasably coupled to the anchors 40.

The heatsink 20 includes a plurality of fins 22 having a substantial amount of heat-transfer surface area relative to the overall dimensions (e.g. L×W×H) of the heatsink 20. The heat-sink 20 cools the CPU 32 by conducting heat away from the CPU 32. Air simultaneously flows over and between the fins 22, usually by forced convection generated by a fan (not shown), to cool the fins 22. As a result, heat is continually transferred from the CPU 32 to the ambient air via the heatsink 20 to cool the CPU 32.

The anchoring system 10 secures the heatsink 20 to the circuit board 30 in a manner that provides positive engagement between the heatsink 20 and CPU 32, to help ensure proper heat conduction between the CPU 32 and the heatsink 20 for cooling the CPU 32. One skilled in the art will appreciate that alternate embodiments may be constructed wherein a heat-generating component other than a CPU may be similarly cooled by a heatsink anchored to a circuit board or other substructure of an electronic device.

Two anchors 40 and one heatsink clip 34 are shown in the embodiment of FIG. 1, although another embodiment may use additional anchors 40 and heatsink clips 34, depending on such factors as the size, mass, and shape of the heatsink 20. The heatsink clip 34 may be formed from a rod or wire made of a resilient material, such as spring steel. The heatsink clip 34 in this embodiment engages the heatsink 20 at a location between adjacent fins 22. The ends of the heatsink clip 34 may be releasably coupled, typically by hand, to the respective anchors 40. The heatsink clip 34 may be releasably coupled to the anchors 40 by positioning the ends 34A, 34B, typically by hand, into a through hole 41 of each respective anchor 40. By way of illustration, a first end 34A of the heatsink clip is shown releasably coupled to a first anchor 40 (shown on the left in FIG. 1) while a second end 34B of the heatsink clip 34 is shown yet unsecured to a second anchor 40 (shown on the right in FIG. 1). The shape of the heatsink clip 34 is such that securing the heatsink clip 34 to the anchors urges the heatsink 20 toward the circuit board 30 and against the CPU 32. The resiliency of the heatsink clip 34 gives the heatsink clip 34 a spring-like quality that biases the heatsink 20 against the CPU 32. Alternatively, securing the heatsink clip 34 to the anchors 40 may place the heatsink clips 34 in tension to urge the heatsink 20 against the CPU 32.

FIG. 2 is a perspective view of an anchor 40, which may be used in the heatsink anchoring system 10 of FIG. 1. The anchor 40 includes an anchor body 42 having a "closed" hook generally indicated at 44 for removably securing the heatsink clip 34 to the anchor 40. The closed hook 44 of this embodiment includes the through hole 41 through the anchor body 42 for receiving an end of the heatsink clip 34 (see the details above regarding the securing of the heatsink clip 34 to the anchors 40 in FIG. 1).

Alternative hooks for releasably securing the heatsink clip 34 to the anchor body 42 are illustrated schematically in FIGS. 2A and 2B. FIG. 2A is a schematic side view of an anchor 40A having an "open" hook 44A coupled to an anchor body 42A. An end of the heatsink clip 34 may be removably secured to the anchor 40A by hooking an end of the heatsink clip 34 under the hook 44A. FIG. 2B is a schematic side view of an anchor 40B having a hook that comprises a closed ring or shackle 44B coupled to an anchor body 42B. The heatsink clip 34 may be removably secured to the anchor 40B by hooking an end of the heatsink clip 34 in the ring or shackle 44B. The hooks shown in FIGS. 2, 2A, and 2B are non-limiting examples of hooks, and other hooks may be devised within the scope of the invention.

Referring again to FIG. 2, a pair of flexible retention prongs 46 extend from the anchor body 42 in a common direction (labeled here as direction "D") away from the hook 44. The flexible retention prongs 46 terminate in barbs 47 at the ends (i.e. the "barbed ends") furthest from the hook 44. The barbs 47 are oriented in opposing directions, with a flat portions referred to as a "catch portion" 48 extending outwardly from the flexible retention prongs 46 and away from one another, but in another embodiment may instead face inwardly toward one another.

A pair of stabilization prongs 49 extends from the anchor body 42 in the direction "D," each in close proximity to a respective one of the flexible retention prongs 46. The stabilization prongs 49 are wider and therefore considerably stiffer than the flexible retention prongs 46. Each stabilization prong 49 is optionally at least fifty percent wider than the adjacent retention prong 46.

A stop 50 is integrated with the anchor body 42. An engagement portion 51 of the stop 50 is positioned (along the direction "D") between the hook 44 and the barbs 47. A pair of opposing springs 54 is integrated with the anchor body 42. Each spring 54 has a free end 55 spaced between the barbs 47 and the engagement portion 51 of the stop 50.

The anchor 40 may be a unitary structure that includes the features of the anchor body 42, integrated spring 54, flexible retention prongs 46, stabilization prongs 49, and hook 44. In other words, these may be physically inseparable features of the anchor 40 as a result of forming the anchor 40 from a single piece of metal sheet, such as by stamping operations, cutting operations, folding operations, or combinations thereof. Also, the anchor 40 is folded around a fold line 45, so that the retention prongs 46 are on one side of the fold line 45 and the stabilization prongs 49 are on the other side of the fold line 45. This folded construction of the anchor 40 allows the retention prongs 46 to flex independently of the stabilization prongs 49.

Figure 3A:
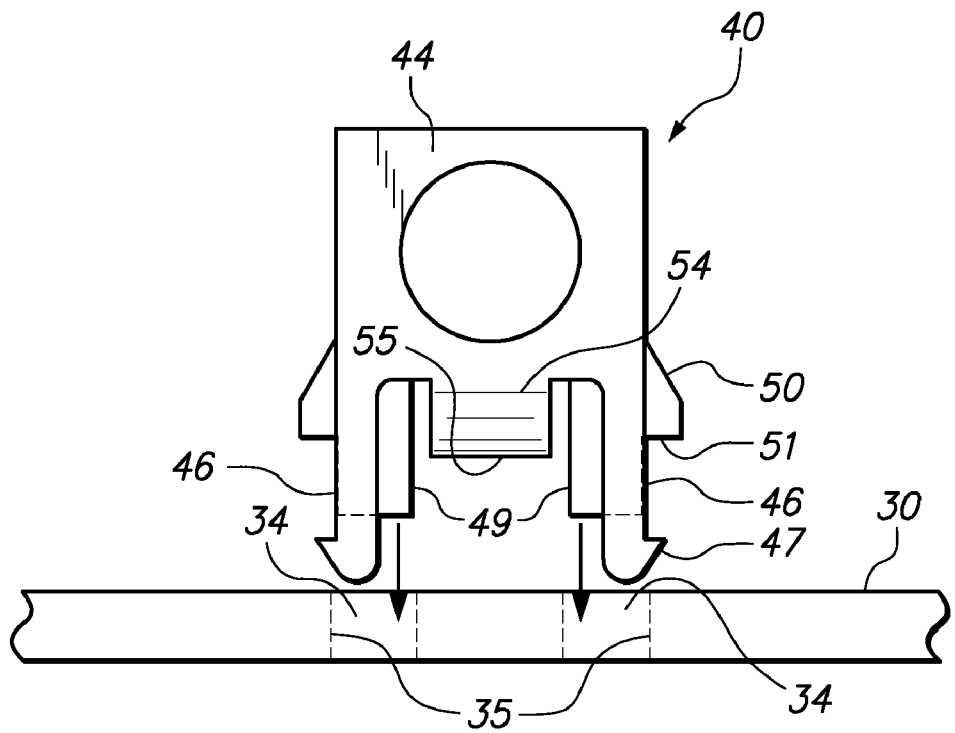
FIG. 3A is a side view of the anchor prior to being secured to the circuit board.
Figure 3B:
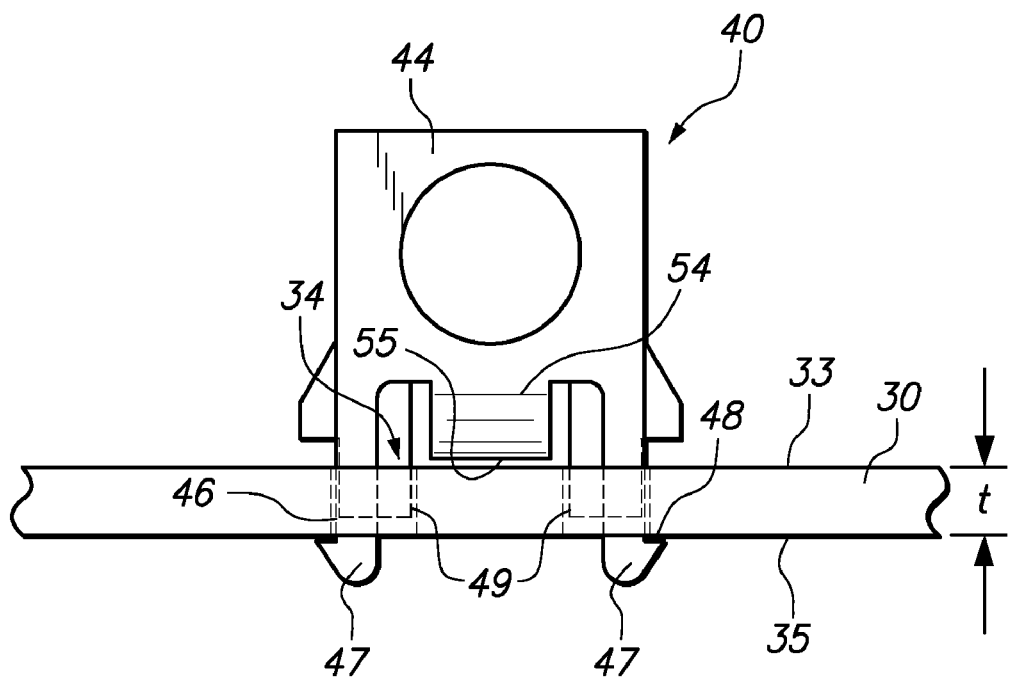
FIG. 3B is a side view of the anchor secured to the circuit board.

FIGS. 3A and 3B illustrate a sequence of securing the anchor 40 to the circuit board 30. FIG. 3A is a side view of the anchor 40 prior to securing the anchor 40 to circuit board 30. The pair of flexible retention prongs 46 and the pair of stabilization prongs 49 are aligned with a corresponding pair of spaced apart openings 34 for subsequent insertion of the retention prongs 46 and stabilization prongs 49 into the openings 34. There is a noticeable interference between an outer edge 35 of the openings 34 and the barbs 47 such that, in response to insertion of the barbs 47 into the openings 34 in the insertion direction indicated by the arrows, the outer edge 35 of the openings 34 would initially cause the flexible retention prongs 46 to flex inwardly so that the openings 34 in the circuit board 30 would receive the flexible retention prongs 46. The substantially wider stabilization prongs 49 are aligned with the openings 34 so that the stabilization prongs 49 will slide directly into the openings 34 without requiring any flexure of the stabilization prongs 49. The anchor 40 becomes secured to the circuit board 30 by pushing the anchor 40 in the direction of insertion indicated by the arrows in FIG. 3A.

FIG. 3B is a side view of the anchor 40 as secured to the circuit board 30. The flexible retention prongs 46 have been inserted into the openings 34 far enough to move the barbs 47 beyond an opposing surface 35 of the circuit board 30 so that the flexible retention prongs 46 return or "spring back" to a relaxed position, as shown, or in another embodiment, at least to a less flexed position than when the barbs 47 were within the openings 34. The barbs 47 retain the anchor 40 on the circuit board 30 and resist the The stabilization prongs 49 are also positioned within the openings 34 in FIG. 3B. The stabilization prongs 49 are wide enough to substantially fill the width of the openings 34, i.e. with relatively little clearance or "play" between the stabilization prongs 49 and the openings 34. In this embodiment, a stabilization prong 49 having a width that is at least ninety percent of the width of the opening 34 into which it is inserted may be considered to "substantially span" or "substantially fill" that opening 34. The extra width of the stabilization prongs 49 in comparison to the flexible retention prongs 46 makes the stabilization prongs 49 substantially stronger and/or more rigid than the flexible retention prongs 46. The increased rigidity of the stabilization prongs 49 and the close fit between the wider stabilization prongs 49 and the openings 34 minimizes lateral or rotational movement of the anchor 40 with respect to the circuit board 30 and increases the stability of the anchor 40 when secured to the circuit board 30. Thus, the flexible retention prongs 46 with the barbed ends provide retention for the anchor 40, while the wider, more rigid stabilization prongs 49 and their general alignment with the openings 34 enhance stability for the retained anchor 40.

The integrated springs 54 (only one spring 54 is visible in FIGS. 3A and 3B) allows the anchor 40 to be firmly secured to a range of thicknesses of the circuit board 30. The free end 55 of each integrated spring 54 is positioned for flexibly contacting the circuit board 30 as the anchor 40 is secured to the circuit board 30 in the sequence of assembly illustrated from FIG. 3A to FIG. 3B. In particular, the free end 55 is spaced from the barbs 47 a distance of less than the thickness "t" of the circuit board. As the flexible retention prongs 46 and rigid stabilization prongs 49 are moved into the openings 34 in this sequence, the free end 55 of each integrated spring 54 contacts an upper surface 35 of the circuit board 30 before the barbs 47 have completely emerged from the openings 34 (i.e. prior to the catch portion 48 moving beyond the opposing surface 35 of the circuit board 30). Thus, the free end 55 of each integrated spring 54 is engaged with the upper surface 35 when the anchor 40 is secured to the circuit board 30. The contact between each integrated spring 54 and the circuit board 30 prevents any appreciable vertical play (with respect to the orientation shown in FIG. 3B). Also, the range of flexure of each integrated spring 54 will accommodate different thicknesses "t" of the circuit board 30. If the thickness "t" of the circuit board to which the anchor is to be secured is increased, each integrated spring 54 will further flex a corresponding amount. The stop 50 limits the insertion of the prongs 46, 49 beyond an initial contact of the free end 55 of each integrated spring 54 with the circuit board 30, to prevent over-compressing the integrated springs 54. In particular, the engagement portion 51 of the stop 50 will engage the surface 33 of the circuit board 30 prior to over-compression of the integrated spring 54.

Although the anchor 40 may remain secured to the circuit board 30 for the duration of the service life of the circuit board 30, it is possible to release the anchor 40 from the circuit board 30, if desired. To release the anchor 40 from the circuit board 30, the flexible retention prongs 46 may be urged inwardly, such as by applying an inward force to the barbs 47, typically using a tool, to flex the flexible retention prongs 46 inward, while lifting the anchor 40 away from the circuit board 30.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heatsink anchor, comprising:
   an anchor body having a hook for receiving a heatsink clip;
   a pair of flexible retention prongs extending from the anchor body in a common direction away from the hook and having barbs on the ends;
   a stop integrated with the anchor body and having an engagement portion positioned along the common direction between the hook and the barbs of the flexible retention prongs; and
   a spring integrated with the anchor body and having a free end spaced along the common direction between the barbs and the engagement portion of the stop.

2. The heatsink anchor of claim 1, further comprising a pair of stabilization prongs extending in the common direction from the anchor body adjacent to the flexible retention prongs, the anchor body being folded about a fold line such that the retention prongs are on one side of the fold line and the stabilization prongs are on another side of the fold line, each stabilization prong having a width greater than the adjacent flexible retention prong.

3. The heatsink anchor of claim 2, wherein the stabilization prongs are stiffer than the flexible retention prongs.

4. The heatsink anchor of claim 2, wherein each stabilization prong is at least fifty percent wider than the adjacent retention prong.

5. The heatsink anchor of claim 1, wherein the hook comprises a hole through the anchor body for receiving an end of the heatsink clip.

6. The heatsink anchor of claim 1, wherein the hook comprises an open hook projecting from the anchor body for receiving an end of the heatsink clip.

7. The heatsink anchor of claim 1, wherein the hook comprises a ring or shackle coupled with the anchor body for receiving an end of the heatsink clip.

8. The heatsink anchor of claim 1, wherein the barbs of the prongs are oppositely facing one another.

9. The heatsink anchor of claim 1, further comprising a unitary structure that includes the anchor body, spring, retention prongs, and hook.

10. The heatsink anchor of claim 9, wherein the unitary structure comprises formed sheet metal.

11. An anchoring system for securing a heatsink to a circuit board, comprising:
    a circuit board having a pair of spaced-apart openings adjacent to a heat-generating circuit-board element;
    an anchor including an anchor body, a hook coupled to the anchor body, a pair of flexible retention prongs extending from the anchor body in a common direction and spaced for insertion into the openings on the circuit board, a barb disposed at the end of each prong and configured for retaining the anchor body on the circuit board upon insertion of the prongs into the openings on the circuit board, a spring integrated with the anchor body and having a free end spaced from the barbs a distance of less than the thickness of the circuit board, and a stop integrated with the anchor body for limiting the amount of insertion of the prongs beyond an initial contact of the free end of the spring with the circuit board; and
    a heatsink clip configured for releasably securing the heatsink to the hook of the anchor with the heatsink in direct thermal contact with the heat-generating circuit-board element.

12. The anchoring system of claim 11, further comprising a pair of stabilization prongs extending from the anchor body adjacent to the flexible retention prongs and positioned for insertion into the openings on the circuit board without flexure, each stabilization prong having a width greater than the width of the adjacent flexible retention prong.

13. The anchoring system of claim 12, wherein the stabilization prongs are also stiffer than the flexible retention prongs.

14. The anchoring system of claim 12, wherein each stabilization prong is at least fifty percent wider than the adjacent flexible retention prong.

15. The anchoring system of claim 12, wherein each stabilization prong spans substantially the full width of the respective opening.

16. The anchoring system of claim 11, wherein the hook comprises a hole through the anchor body for receiving an end of the heatsink clip.

17. The anchoring system of claim 11, wherein the hook comprises an open hook projecting from the anchor body for receiving an end of the heatsink clip.

18. The anchoring system of claim 11, wherein the hook comprises a ring or shackle coupled with the anchor body for receiving an end of the heatsink clip.

19. The anchoring system of claim 11, further comprising a unitary structure that includes the anchor body, spring, retention prongs, and hook.

20. The anchoring system of claim 19, wherein the unitary structure comprises formed sheet metal.

* * * * *